United States Patent [19]
Jurgensen et al.

[11] Patent Number: 5,620,573
[45] Date of Patent: Apr. 15, 1997

[54] REDUCED STRESS TUNGSTEN DEPOSITION

[75] Inventors: Charles W. Jurgensen, Colorado Springs, Colo.; Ratnaji R. Kola, Berkeley Heights; Gabriel L. Miller, Westfield, both of N.J.; Henry I. Smith, Sudbury, Mass.; Eric R. Wagner, South Plainfield, N.J.

[73] Assignee: Lucent Technologies Inc., Murray Hill, N.J.

[21] Appl. No.: 431,355

[22] Filed: Apr. 28, 1995

[51] Int. Cl.⁶ .......................... C23C 14/00; C23C 14/32
[52] U.S. Cl. ........................... 204/192.13; 430/5; 216/12
[58] Field of Search .......................... 430/5; 156/625.1; 204/192.13, 298.03, 192.12, 192.15; 427/585

[56] References Cited

U.S. PATENT DOCUMENTS

| | | | |
|---|---|---|---|
| 4,893,071 | 1/1990 | Miller | 324/660 |
| 5,382,340 | 1/1995 | Kola et al. | 204/192.13 |
| 5,480,529 | 1/1996 | Kola et al. | 204/298.03 |

FOREIGN PATENT DOCUMENTS 389198  9/1990  European Pat. Off. .......... G03F 1/14

OTHER PUBLICATIONS

"Uniform-Stress Tungsten on X-Ray Mask Membranes Via He-backside Temperature Homogenization" by Mondol, M. et al., *J. Vac. Sci. Technol.* B 12(6), pp. 4024–4027 (Nov. 1994).

"Tungsten Patterning for 1:1 X-Ray Masks", by Jurgensen, C.W. et al, *J. Vac. Sci. Technol.* B 9 (6), pp. 3280–3286 (Nov. 1991).

"Control of Optical and Mechanica Properties of Polycrystalline Silicon Membranes for X-Ray Masks", Trimble, L.E., Celler, G.K., Frackoviak, J., SPIE, vol. 1263, Electron-Beam, X-Ray, and Ion-Beam Technology: Submicrometer Lithographies IX, pp. 251–258, (1990).

"In Situ Stress Monitoring and Deposition of Zero–Stress W for X–Ray Masks", Ku, Y.-C., Ng, L.-P., Carpenter, R., Lu, K., Smith, H.I., Haas, L.E., Plotnik, I., Journal Vacuum Science Technology, B, vol. 9, No. 6, pp. 3297–3300, Nov./Dec. 1991.

"Stable Low–Stress Tungsten Absorber Technology for Sub–Half–Micron X–Ray Lithography", Kola, R.R., Celler, G.K., Frackoviak, J. Jurgensen, C.W., Trimble, L.E., Journal Vacuum Science Technology, B, vol. 9, No. 6, pp. 3301–3305, (Nov./Dec. 1991).

"A Feedback Method for Investigating Carrier Distributions in Semiconductors", Miller, G.L., IEEE Transactions on Electron Devices, vol. ED–19, No. 10, pp. 1103–1108, (Oct. 1972).

"Uniform–Stress Tungsten on X–Ray Mask Membranes Via He–Backside Temperature Homogenization", Mondol, M., Li, H. Owen, G., Smith, H.I., Journal Vacuum Science Technology, B. 12(6), pp. 4024–4027, (Nov./Dec. 1994).

Jurgensen, C.W., Kola, R.R., Novembre, A.E., Tai, W.W., Frackoviak, J., Trimble, L.E., Celler, G.K., "Tungsten Patterning for 1:1 X–Ray Masks", J. Vac. Sci. Technol. B 9 (6), pp. 3280–3286 (Nov./Dec. 191).

*Primary Examiner*—S. Rosasco
*Attorney, Agent, or Firm*—Richard J. Botos

[57] ABSTRACT

X-ray masks are typically made by depositing and patterning a layer of heavy metal on a thin supporting membrane. The metal layer must have a relatively low and uniform stress to prevent stress-induced deformation of the pattern. Tungsten films having excellent stress characteristics are produced by employing a continuously operating capacitance-based measurement technique to allow adjustment of the deposition conditions in rapid response to changes in stress of the film being deposited. The stress gradients in the film are further reduced by transferring heat from the membrane as the metal is deposited thereon.

7 Claims, 3 Drawing Sheets

REDUCED STRESS TUNGSTEN DEPOSITION

BACKGROUND OF THE INVENTION

1. Field of the Invention

This invention relates to fabrication of x-ray masks and, in particular, masks including a patterned metal on a membrane.

2. Art Background

As design rules in the manufacture of devices, e.g. integrated circuits opto-electronic devices, and micro-mechanical structures, become smaller, the radiation employed for lithography, in turn, must be of a correspondingly shorter wavelength. Thus, for example, when the design rule is below 0.5 μm, use of short wavelength radiation such as x-ray radiation (radiation having a wavelength typically in the range 4 to 150Å) has been suggested.

During exposure, energy incident on a mask which defines a pattern is transmitted in this pattern to expose an underlying energy sensitive material. The energy sensitive material after this exposure is delineated into the pattern by development and employed in the manufacture of the desired device. For x-ray exposure, the mask is generally a membrane formed on a supporting structure, with a region of patterned metal on the membrane surface. Typically, the membrane is a material such as Si, $SiN_x$(x is typically between 1 and 1.3) or SiC, and has a thickness generally in the range 0.1 to 4 μm.

Since the membranes must be quite thin to avoid excessive attenuation of incident energy, substantial stress, i.e. stress greater than 50 MPa, imposed on the membrane from the overlying metal pattern is unacceptable because it causes unacceptable distortion of the pattern. The requirement of limited stress, in turn, imposes substantial limitations on the process of forming the overlying metal pattern.

In a typical mask fabrication procedure, a layer of metal is deposited on a membrane using a technique such as sputtering. A pattern in polymeric material is formed over the metal layer, and the metal regions not covered by the polymeric material are removed by etching. Subsequent removal of the overlying polymeric material leaves a patterned metal overlying the membrane.

Various materials have been suggested for use in the metal layer. Although gold is relatively easy to deposit, its presence in device manufacturing environments and in particular, integrated circuit manufacturing environments, is not preferred. Gold impurities, even in extremely small amounts, introduced into an integrated circuit often substantially degrade the properties and reliability of the device. Stress in gold films is also known to change with time, even at room temperature. Recent studies indicate that at temperatures above 70° C., stresses increase rapidly. Therefore, materials other than gold have been investigated.

One alternative to gold is tungsten. Although tungsten is considered compatible with an integrated circuit manufacturing environment, tungsten films deposited on a membrane generally induce substantial compressive or tensile stress that ultimately distorts the required pattern or even produces membrane failure. Various attempts have been made to reduce the stress associated with the deposition of tungsten. For example, as described by Y. C. Ku et al, *Journal of Vacuum Science & Technology*, B9, 3297 (1991), a monitoring method is employed for determining stress in the tungsten being deposited. This monitoring method is based on the resonant frequency f of a circular diaphragm of the composite structure which, in turn, is related to the stress by the equation:

$$f = \frac{1}{2.61\,r} \left\{ \frac{\sigma_m t_m + \sigma_f t_f}{\rho_m t_m + \rho_f t_f} \right\}^{\frac{1}{2}}, \quad (1)$$

where r is the radius of the membrane, $\sigma_m$, $\rho_m$, and $t_m$ are stress, density, and thickness of the membrane respectively, and the corresponding terms such as $\sigma_f$ are stress, density, and thickness respectively, of the film. Since the density of the film and membrane are generally known, this equation allows calculation of stress once the resonant frequency and film thickness are measured.

Ku and coworkers used a commercially available optical distance measuring device to monitor diaphragm position. Movement of the diaphragm was induced by electrostatic forces applied to the diaphragm from an electronic oscillator-driven capacitively coupled electrode. The oscillator frequency was slowly swept to allow location of the diaphragm mechanical resonance and from this value, the stress was determined.

SUMMARY OF THE INVENTION

It has been found that frequent and rapid measurement of stress is required to allow adjustments in a tungsten deposition system so that stress in the deposited tungsten is meaningfully reduced. Resonant frequency determinations allowing such adjustment at least 6 times per minute, are required to significantly improve stress characteristics. This measurement performance is advantageously achieved in a resonant frequency technique by employing a single electrode monitoring system. This system capacitively drives the diaphragm and simultaneously determines its frequency by maintaining it in mechanical oscillation at its resonant frequency. Use of a single multi-function electrode in this way is quite difficult since the system must exhibit negligible crosstalk between the measuring and driving functions. The system must also be immune to the very high power rf frequency typically employed in the sputtering deposition procedure itself. Further, the capacitance from the backplate to the diaphragm is quite small i.e. less than 20 pF, while associated parallel stray capacitances to ground are generally significantly larger, compounding the difficulties.

These problems are overcome, and rapid measurement is achieved, utilizing the apparatus shown schematically in FIG. 1. A bifilar transformer (1), high voltage emitter follower 2, and shielded cable 3 are employed both to avoid these various problems and to maintain the diaphragm in continuous oscillation. Additionally, since the diaphragm is maintained at its resonant frequency, even though the film thickness is continuously changing, continuous determinations of stress are available. In this manner stress is reducible by adjusting process parameters, such as sputtering gas pressure and/or rf power, in response to the stress measurements. This portion of the present invention is described in U.S. Pat. No. 5,382,340 to Kola et at.

As tungsten is formed on the membrane, heat collects in the membrane. This heat is conducted away from the membrane by the membrane support structure. Consequently, a thermal gradient is introduced into the membrane, because heat builds up in the portion of the membrane that is not over the support structure. This thermal gradient causes a stress gradient in the deposited metal. The above technique is enhanced by transferring heat from the membrane as the tungsten is deposited thereon to reduce the thermal gradient.

The heat is transferred using a suitable heat transfer mechanism. In one embodiment a heat transfer gas is introduced through apertures in the electrode. The gas transfers heat from the membrane to the electrode. The gas reduces the temperature gradient across the membrane that is caused by the sputter deposition of tungsten thereon. This reduction in the temperature gradient in turn reduces the stress gradient in the sputter-deposited tungsten caused by the temperature gradient.

DETAILED DESCRIPTION

Figure 1:
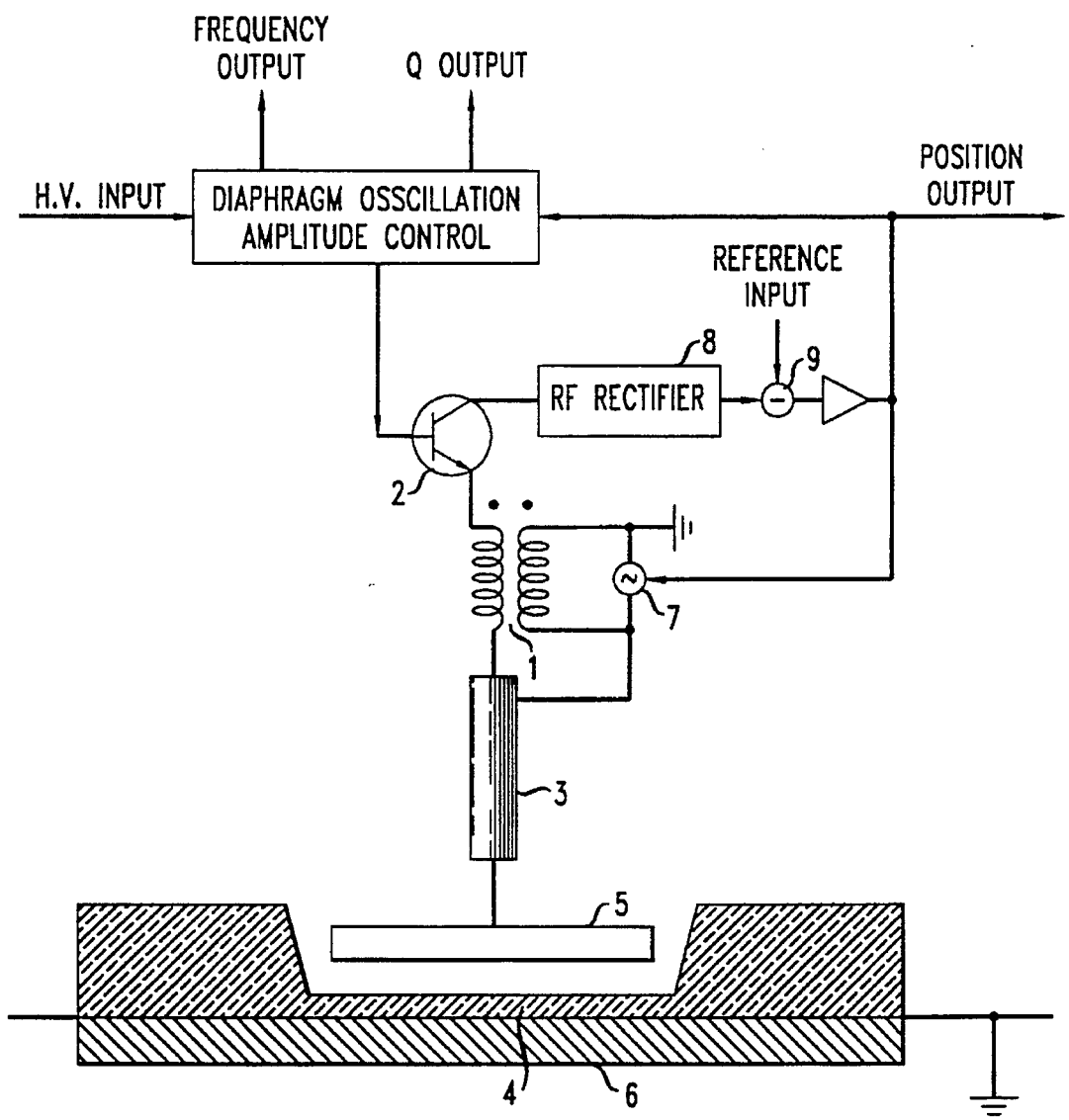
FIG. 1 is a schematic of an apparatus for practicing the present process.

As discussed, the invention involves the realization that to control stress during deposition of metals on a membrane, it is necessary to frequently measure this stress during deposition and adjust deposition conditions accordingly. Typically, for membranes having thicknesses in the range 0.1 to 4 μm formed of materials such as $Si, Si_c$, and $SiN_x$ and with deposits of metals such as tungsten, at least 6 measurements per minute should be made. Stress in the evolving metal film is then adjusted by correcting parameters such as sputtering gas pressure and/or rf power. The total stress depends on these parameters in a complicated manner, but typically compressive stress decreases with an increase in sputtering gas pressure or with a corresponding decrease in rf power.

Although the particular method employed to obtain the necessary measurement of stress is not critical, previous techniques (involving relatively slow frequency scanning to establish a membrane resonant frequency) are clearly inadequate. By contrast it has been found that a technique which maintains the membrane at its resonant frequency while utilizing a single driving and measuring electrode, is particularly advantageous in this regard.

In the one-electrode technique, the capacitance between the membrane 4 and the electrode 5 is measured and electronically processed in such a way that the output is a linear function of the distance between the electrode and the membrane. (See G. L. Miller U.S. Pat. No. 4,893,071, dated Jan. 9, 1990, (which is hereby incorporated by reference) and especially FIGS. 8 and 9 with accompanying text in column 6, line 46, to column 7, line 60.) From this measurement, a voltage is made available which indicates the position of the membrane, i.e. its distance from the backplate. This voltage is then suitably added to a large, fixed, high voltage (typically approximately 150 volts) and applied back to the electrode 5 via the emitter follower 2 and transformer 1. The operation of this whole loop is such as to continuously maintain the diaphragm in mechanical oscillation at its resonant frequency. Measurement of that frequency, coupled with the use of Equation 1, allows the stress to be determined.

A system for achieving this result is shown in FIG. 1. The diaphragm 4 with its metal layer 6 being deposited, is shown relative to an electrode 5. This electrode is driven by an rf oscillator 7 through a bifilar, one-to-one transformer 1. The rf output of the oscillator is coupled through this transformer to the electrode and is also imposed on a driven shield 3. Since the shield and the lead to the electrode are maintained at the same RF potential, no error due to capacitance between the shield and the center lead of the cable is introduced.

The capacitive measurement of distance using a feedback loop through an rf rectifier 8, and comparison to a reference input 9, has been discussed in U.S. Pat. No. 4,893,071, dated Jan. 9, 1990 (with particular reference to FIGS. 8 and 9). Additionally, related distance measurements based on capacitance have also been discussed in a publication by G. L. Miller in *IEEE Transactions on Electron Devices*, ED-19, pages 1103–1108, October, 1972.

The disc electrode 5 is driven with RF (typically approximately 1 V p-p at 3 MHz) via a toroidal bifilar transformer 1. The fax end of the secondary of this transformer is connected to the emitter of a high voltage transistor emitter follower 2 (all power supply and biasing arrangements have been omitted for clarity). Essentially all of the RF 3 MHz displacement current flowing from the disc 5 to the diaphragm 4 therefore flows out of the collector of 2. (Note that the lead to the disc itself is provided with an accurately driven shield 3 to remove the dead capacitance effect.)

The RF current from the emitter follower 2 collector passes through a tuned amplifier (not shown) to a rectifier, the output of which is therefore a measure of the disc to diaphragm spacing. The rectifier output is then compared with a constant (demanded) value 9 and the error signal between the two is used in turn to servo the oscillator 7 (typically 3 MHz) amplitude. In this way the oscillator 7 amplitude itself is accurately and linearly proportional to the position of the diaphragm, i.e. is a linear measure of the spacing from the diaphragm 4 to the backplate 5. This is necessarily so since the operation of this whole electronic loop is such, in effect, as to force a constant magnitude of RF displacement current through the capacitor formed by the backplate 5 and the membrane 4. The system output voltage is simply a linear measure of the magnitude of the RF voltage needed to achieve this end. As such it is proportional to the spacing between the diaphragm and the backplate.

Given such a position signal it is then only necessary to appropriately feed it back as a DC level through emitter follower 2 to cause the diaphragm to constantly oscillate at its resonant frequency. As a pedagogic aid it is possible to visualize this process physically. As long as the diaphragm is moving towards the backplate the DC voltage across the gap is increased above its static value of approximately 150 volts. While the diaphragm is moving away from the backplate the voltage is correspondingly decreased. The associated electrostatic forces cause the diaphragm to oscillate at its resonant frequency. A separate loop stabilizes the magnitude of the diaphragm oscillatory motion by servoing the feedback voltage amplitude. This subsidiary loop also provides damping, or Q, information.

It is desirable to maintain the stress level at a relatively low value, e.g. below 50 MPa, preferably below 10 MPa. Thus, the deposition process parameters as previously discussed are adjusted until the output indicates an appropriate reduction in stress level.

Figure 2:
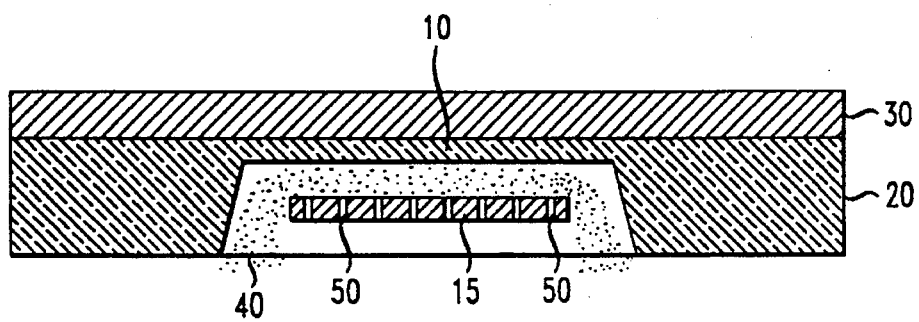
FIG. 2 is a schematic of the back-side cooling apparatus of the present invention.

The stress gradients in the metal are reduced by transferring heat from the backside of the membrane, i.e. the side of the membrane opposite the side on which the tungsten is being deposited, as tungsten is deposited thereon. As illustrated in FIG. 2, the membrane 10 is typically formed on a silica or glass support structure 20. As the tungsten 30 is sputtered onto the top surface of the membrane 10, heat is conducted through the membrane 10 and channeled into the support structure 20, which acts as a heat sink. Consequently, heat collects in the portions of the membrane 10 that do not overlie the support structure 20. This causes an unequal temperature distribution in the membrane. This unequal temperature distribution causes an unequal distribution of stress (i.e., a stress gradient) in the tungsten metal.

One mechanism for conducting heat from the membrane 10 is illustrated in FIG. 2. In this mechanism a gas 40 is introduced between the membrane and the backplate 15. The backplate 15 has apertures 50 that serve as a manifold through which the gas is introduced into the space between the backplate and the membrane. If desired, the backplate 15 can serve as both manifold and electrode. If the backplate 15 serves as an electrode it is connected to the apparatus as depicted in FIG. 1. This gas 40 is selected so that it efficiently conducts heat away from the membrane. The gas is also selected so that it will not cause the membrane to oscillate in a manner that significantly interferes with resonant frequency of the membrane. In this regard, it is advantageous if the gas is a low molecular weight gas with a heat transfer coefficient that is at least about 0.01 W/cm$^2$–° C. Helium is one example of a suitable gas, although other non-reactive gases such as Argon are contemplated. The heat transfer coefficient of helium gas varies with pressure and is greater than 0.01 W/cm$^2$–° C. at pressures above 0.25 Torr.

The pressure of the gas is selected so that the rate at which the heat is removed from the membrane that does not overlie the support structure is comparable to the rate at which the heat is introduced into the membrane from the plasma. It is contemplated that helium gas is at a pressure of about 0.25 Torr to about 5 Torr and at room temperature. The pressure of the gas is selected so that it will not deflect the membrane to an extent that would adversely affect the ability to measure the resonant frequency of the membrane. In this regard it is advantageous if the backside cooling gas does not exceed about 5 Torr. The distance between the membrane and the backplate also affects the efficiency of the heat transfer from the membrane. Consequently, it is advantageous if the distance between the backplate and the membrane is adjustable. It is advantageous if the distance is less than the mean free path (i.e., the average distance a molecule of gas will travel before being deflected) of the heat transfer gas. Distances of about 100 µm to about 5000 µm are contemplated.

The following examples are illustrative of the techniques involved in the invention.

EXAMPLE 1

A 1 µm silicon membrane having a stress of approximately 260 MPa was prepared as described in L. E. Trimble et at., *SPIE*, Vol. 1263, "Electron Beam, X-Ray, and Ion-Beam Technology: Submicrometer Lithographies IX" (1990), pp. 251–258. This membrane was placed on the sample holder of a conventional sputtering apparatus. The apparatus was configured such that the gap between the measurement electrode (approximately 2.6 cm diameter) and the membrane was 250 µm. (The measuring circuitry was, as shown in FIG. 1.) The chamber was evacuated to a base pressure of approximately 1×10$^{-7}$ Torr. An argon gas flow rate was established to maintain the chamber pressure at approximately 20 mTorr. (This pressure was chosen to be near the compressive-to-tensile transition pressure of 18 mTorr so that adjustments necessarily performed during deposition would not be excessively large. The determination of this transition pressure was done as described by R. R. Kola et al, in *Journal of Vacuum Science and Technology*, B9, page 3301 (1991).)

Figure 3:
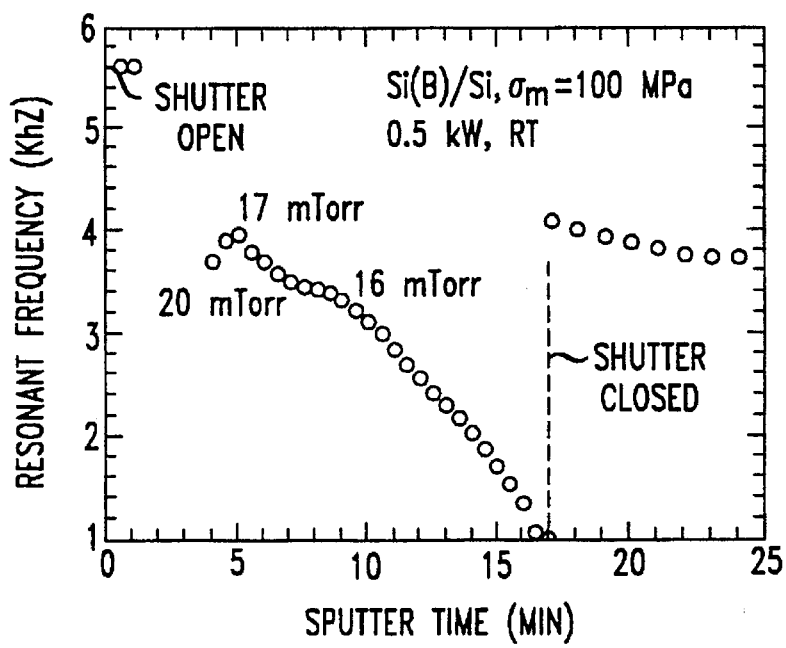
FIG. 3 is a graph illustrating the resonant frequency of the membrane as a function of pressure and sputtering time.

A plasma was struck in the argon at 13.56 MHz with a power density of 1.6 W/cm$^2$ to induce sputtering from an 8 inch tungsten target having a purity of 99.999%. After approximately 5 minutes, a shutter positioned between the target and the sample was opened. The resonant frequency, as determined from the measured voltage from the electronic circuitry and Equation 1, immediately dropped by about 2.5 KHz due to the temperature difference between the thin membrane and the thick silicon substrate. The temperature equilibrated in approximately 5 minutes. (This frequency drop in equilibration is shown in FIG. 3 in the left hand portion of the curve. Measurements were delayed slightly from initial shutter opening in this Example to allow the membrane to come into tensile stress and, thus, to avoid any possibility of membrane fracture.) The resonant frequency was then continuously monitored and the pressure adjusted so that this measured resonant frequency followed, as the deposited thickness increased, the frequency trend predicted by Equation 1 for zero stress.

Figure 4:
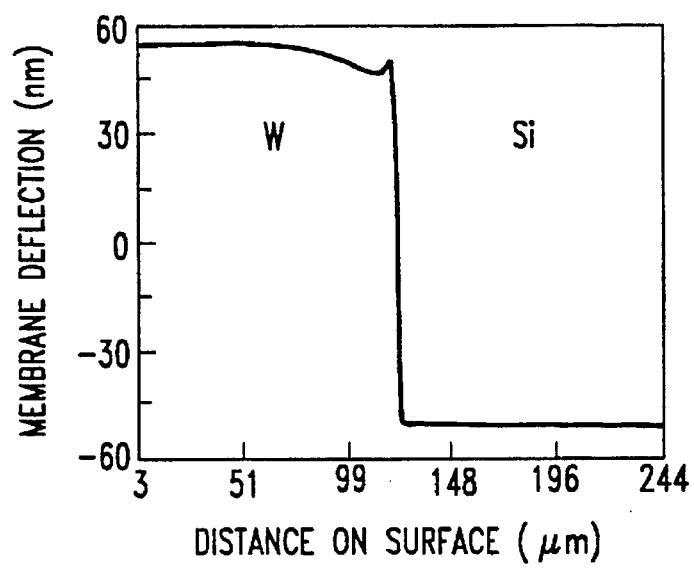
FIG. 4 illustrates the relationship between membrane deflection and distance on the membrane surface.

The predicted resonant frequency in Equation 1, however, does not provide for temperature effects. To correct for temperature effects, the resonant frequency of the composite membrane for the final desired deposited thickness was empirically determined under identical deposition conditions using a series of control samples. In these samples, the deposition procedure described in this example was followed to the final deposited thickness of 0.5 µm. The deposited tungsten was removed from half the membrane, and the membrane deflection at the resulting tungsten edge was measured using a WYKO optical interferometer. The final resonant frequency of the sample showing zero deflection (as shown in FIG. 4) for this interferometric measurement is the temperature corrected, zero stress frequency. The determined zero stress resonant frequency, under the conditions employed, was 3.85 KHz.

Adjustments during deposition were continued so that at the final thickness, the resonant frequency measured 1.1 KHz. (The resonant frequency during the run as a result of pressure adjustments to control stress is shown in FIG. 3.) The shutter was then closed, inducing the resonant frequency to increase by about 2.7 KHz since the membrane cooled substantially faster than the substrate. (This increase was compensated for so that the final room temperature frequency of the membrane was 3.85 KHz.) The sample was then allowed to cool in flowing argon for approximately 10 minutes. The sample was evaluated by removing the tungsten film from half the wafer. Straight interference fringes across the resulting tungsten edge indicated a stress very close to zero.

The same procedure was repeated for a silicon nitride membrane on a silicon substrate and a silicon nitride membrane on a glass substrate. In each case, final tungsten stresses below 10 MPa were achieved.

EXAMPLE 2

Figure 6:
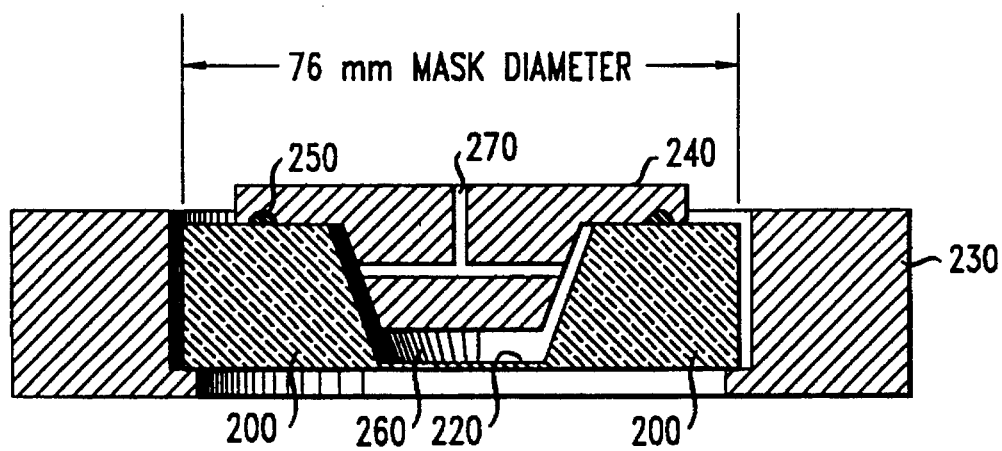
FIG. 6 is an example of a back-side cooling apparatus suitable for practicing the present process.

Referring to FIG. 6, a 1 micron thick silicon membrane 220 having a stress of about 260 MPa was formed on a silicon support structure as described in Trimble, L. E., et at., "Electron Beam, X-Ray, and Ion-Beam Technology: Submicrometer Lithographies IX, "*SPIE*, Vol. 1263, pp. 251–258 (1990). This structure was placed on the sample holder 230 of a conventional sputtering apparatus described in U.S. patent application Ser. No. 07/850637 which was filed concurrently with U.S. Pat. No. 5,382,340 and incorporated by reference therein.

An aluminum electrode backplate 240 that was machined to match the shape of the backside of the mask 200 was placed at the backside of the mask. The distance between the membrane 220 and the backplate 260 was variable from about 100 microns to about 5000 microns. A distance of about 100 microns was selected for this example. The backplate had holes 270 machined therein to channel gas into the space between the backplate 240 and the mask membrane 220. The mask was placed in the sputtering chamber through a loadlock.

The chamber was evacuated to a base pressure of about $1\times10^{-7}$ Torr. A He-flow apparatus was connected to the backplate using linear-motion feedthrough. The electrical contact to the backplate was also made using shielded electrical connections attached to this same linear-motion feedthrough to enable the resonant frequency of the membrane to be measured for in-situ stress control as described above.

He gas at a pressure of about 2 Torr was introduced into the space through the holes in the backplate via external variable-rate leak valves. The He gas was at room temperature. The He flow rate was about 1 sccm.

Tungsten was then deposited on the membrane under the conditions described in the previous example. A 0.3 micron-thick film was formed on the membrane under these conditions. After the film had been formed, the plasma was turned off. The He supply valve was closed and the He gas was evacuated from the backside of the membrane to zero pressure. The He flow apparatus was then moved back to its previous position, again using linear-motion feedthrough.

EXAMPLE 3

Two tungsten films were formed on silicon membranes as described in the previous example. One of the films was formed using He backside cooling as described in the previous example and one of the films was formed without He backside cooling. The out-of-plane distortion (OPD) of these films was measured using an optical interferometer. Low magnification measurements were made using a Mark II optical interferometer obtained from the Zygo Corporation of Middlefield, Conn. High magnification OPD measurements were made using a Wyko Topo-3D optical interferometer obtained from the Wyko Corporation of Phoenix, Ariz. Low magnification measurements were made to view the entire mask. OPD is caused by stress and stress gradients in the metal. The larger the OPD in a membrane, the larger the metal stress and the larger the stress gradients.

Figure 5:
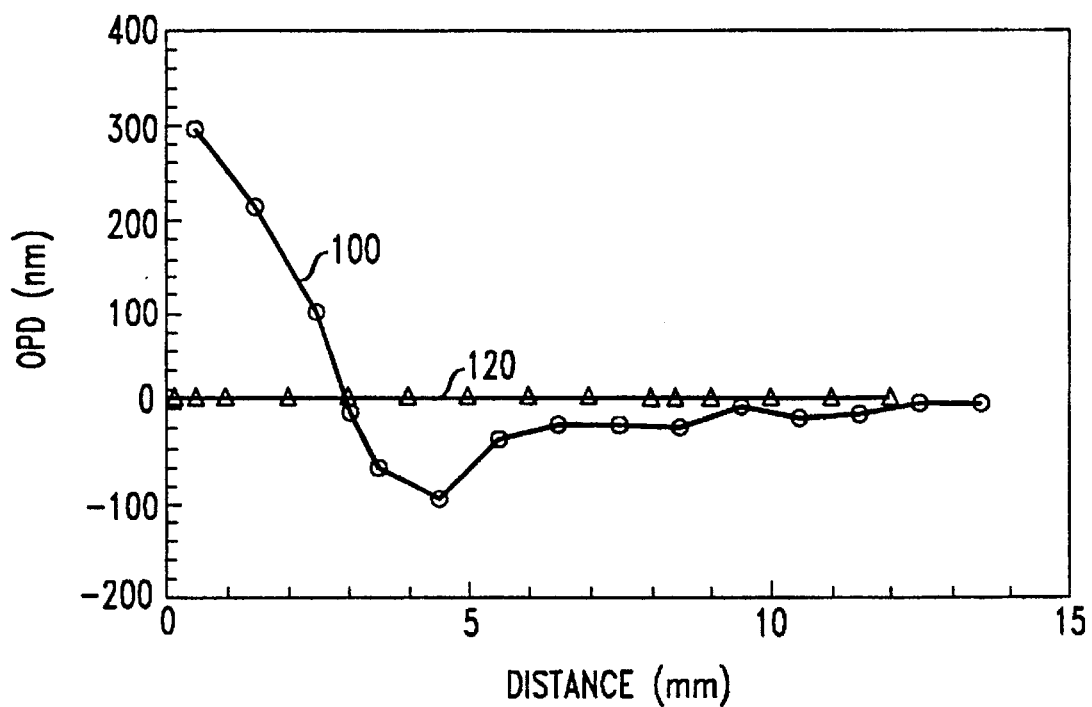
FIG. 5 illustrates the effect of temperature gradient (stress gradient) on the out of plane distortion of a membrane after the deposition of tungsten thereon.

FIG. 5 compares the OPD of a membrane on which a tungsten film was formed without backside cooling to the OPD of a membrane on which a tungsten film was formed using backside cooling. In FIG. 5, the OPD of the membrane is reported as function of the position from the membrane edge. As illustrated in FIG. 5, the OPD of the membrane on which tungsten was formed without backside cooling 100 is much higher and varies more than the OPD of the membrane on which tungsten was formed using backside cooling 120. In fact, the membrane on which tungsten was formed using He backside cooling had virtually no OPD. As expected, the portion of the membrane near the edge of the membrane which was not He backside cooled during tungsten deposition thereon had significant OPD near the edge of the membrane. This is caused by the difference between the membrane temperature at the edge of the membrane (the portion of the membrane that overlies the silicon support structure) and the membrane temperature in the center of the membrane (which does not overlie the support structure).

We claim:

1. A process for fabricating a device comprising the steps of depositing tungsten on a membrane and patterning said tungsten characterized in that at least some of the heat introduced into the membrane as a result of said deposition is conducted away from the membrane by introducing a gas onto the backside of the membrane as the tungsten is formed on the front side of the membrane and the stress generated during said deposition is monitored by measurement of a property relatable to said stress, and adjustment of said deposition process is made in accordance with said measurement sufficiently frequently such that said adjustment based on said measurement is possible at least 6 time per minute.

2. The process of claim 1 wherein the gas conducts the heat to a heat sink.

3. The process of claim 2 wherein the gas has thermal conductivity of at least about 0.01 W/cm$^2$–° C.

4. The process of claim 3 wherein the distance between the membrane and the heat sink is less than the mean free path of the gas between the membrane and the heat sink.

5. The process of claim 4 wherein the gas is an inert gas.

6. The process of claim 5 wherein the gas is selected from the group consisting of helium and argon.

7. The process of claim 4 wherein the gas pressure is about 0.25 Torr to about 5 Torr.

* * * * *